US 9,730,288 B2

(12) United States Patent
Haskvitz (10) Patent No.: US 9,730,288 B2
(45) Date of Patent: Aug. 8, 2017

(54) DIMMABLE ANALOG AC CIRCUIT

(71) Applicant: Once Innovations, Inc., Plymouth, MN (US)

(72) Inventor: David Haskvitz, St. Michael, MN (US)

(73) Assignee: Once Innovations, Inc., Plymouth, MN (US)

( * ) Notice: Subject to any disclaimer, the term of this patent is extended or adjusted under 35 U.S.C. 154(b) by 0 days.

(21) Appl. No.: 15/251,548

(22) Filed: Aug. 30, 2016

(65) Prior Publication Data

US 2017/0064781 A1 Mar. 2, 2017

Related U.S. Application Data

(60) Provisional application No. 62/212,015, filed on Aug. 31, 2015.

(51) Int. Cl.
| | | |
|---|---|---|
| H05B 33/08 | (2006.01) | |
| H01L 33/62 | (2010.01) | |
| A01G 7/04 | (2006.01) | |

(52) U.S. Cl.
CPC ........... *H05B 33/083* (2013.01); *A01G 7/045* (2013.01); *H01L 33/62* (2013.01); *H05B 33/089* (2013.01); *H05B 33/0815* (2013.01); *H05B 33/0845* (2013.01)

(58) Field of Classification Search
CPC .... H05B 37/02; H05B 37/0227; H05B 33/08; H05B 33/0815; H05B 33/0845; H05B 33/083; H05B 33/089; A01G 7/045; H01L 33/62
USPC ........ 315/185 R, 187, 192, 209 R, 210, 291, 315/307, 308, 312
See application file for complete search history.

(56) References Cited

U.S. PATENT DOCUMENTS

| | | | |
|---|---|---|---|
| 7,847,486 B2 * | 12/2010 | Ng | H05B 33/0812 |
| | | | 315/119 |
| 8,907,576 B2 | 12/2014 | Ferrier | |
| 2011/0227490 A1 | 9/2011 | Huynh | |
| 2012/0001558 A1 | 1/2012 | Vos | |
| 2013/0069536 A1 | 3/2013 | Ni | |
| 2013/0169159 A1 | 7/2013 | Lys | |
| 2013/0187572 A1 | 7/2013 | Grajcar | |
| 2015/0237696 A1 | 8/2015 | Shackle | |

FOREIGN PATENT DOCUMENTS

WO  WO-20130169159 A1  7/2013

OTHER PUBLICATIONS

"International Application Serial No. PCT/US2016/049433, International Search Report mailed Nov. 15, 2016", 2 pgs.
"International Application Serial No. PCT/US2016/049433, Written Opinion mailed Nov. 15, 2016", 6 pgs.

* cited by examiner

*Primary Examiner* — Jimmy Vu
(74) *Attorney, Agent, or Firm* — Schwegman Lundberg & Woessner, P.A.

(57) ABSTRACT

An analog AC circuit for light emitting diode (LED) groups that provides continuously emitted light through a dimming process from 100% relative light output to 5% of relative light output. The analog AC circuit utilizes ancillary circuitry that bypasses a first series interconnection of a first LED group and presents a capacitor electrically connected to an ancillary transistor to provide constant current at above a current threshold to cause the first LED group to continuously emit light even through a dimming process.

19 Claims, 3 Drawing Sheets

DIMMABLE ANALOG AC CIRCUIT

CLAIM OF PRIORITY

This patent application is based upon and claims benefit of priority to U.S. Provisional Patent Application Ser. No. 62/212,015, entitled "DIMMABLE ANALOG AC CIRCUIT," filed Aug. 31, 2015, which is incorporated by reference herein in its entirety.

BACKGROUND

LED lighting as an energy efficient lighting source is becoming more and more popular world-wide. Several ways exist regarding how to successfully operate and dim LED devices. In particular, typically line voltage is AC or alternating current voltage where the voltage and current are represented by a sine wave. One circuit that can be used to operate and dim LED lighting utilizes a rectifier and AC to DC converter in association with a pulse width modulation (PWM) device to provide dimming.

In an alternative embodiment, Applicant eliminated the AC to DC converter and need for a PWM device through conditioning the AC current directly provided to the LEDs. This example is shown in Applicant's U.S. Pat. No. 8,373, 363, which is incorporated in full herein. While effective at operating and dimming, problems remain. During analog operation there are times during operation where current exists at zero cross for extended periods of time. For certain operations light is desired during this period. As one example, some flicker indexes put out by specification makers focus, not just on frequency of the AC sine wave, but also on the drop in current from peak to the valley of the sine wave.

OVERVIEW

This document pertains generally, but not by way of limitation, to LED lighting circuits. More specifically this document pertains to a circuit for providing improved operation of an LED lighting device.

A need exists in analog circuits to reduce the gap between peak current and the current at a valley to improve dimming properties and provide additional functionality to a lighting device. In horticulture applications, Applicant has found that low levels of green light can be beneficial to plant growth and should be used in combination with other colored lighting to optimize growth in plants.

Therefore, a principle object of the present application is to improve dimming functionality of an AC analog circuit. Yet another object of the present application is to improve functionality on an AC analog circuit. These and other objects, features, and advantages will become apparent from the specification and claims.

The present inventors have recognized, among other things, that The present subject matter can help provide a solution to these problems, such as with, a circuit with a first series interconnection of a first light-emitting diode (LED) group and a second series interconnection of a second LED group that are in series. The first series interconnection has a cathode coupled to a drain terminal of a first transistor and a source terminal of the first transistor is coupled to a first terminal of a first resistor to provide biasing voltage for the first transistor. Similarly the second series interconnection is coupled to a drain terminal of a second transistor and a source terminal of the second transistor is coupled to a first terminal of a second resistor to provide a biasing voltage for the second transistor. Ancillary circuitry is placed within the circuit to bypass the first series interconnection and utilizes a capacitor electrically connected to an ancillary transistor that is provided a biasing voltage from an ancillary resistor such that current is continuously provided to the first series interconnection throughout operation, including through a dimming process such that the first series interconnection continuously emits light during operation of the circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Driving circuitry for powering light emitting diode (LED) lights generally rely on digital circuitry to measure the instantaneous value of a driving voltage, on a microprocessor to identify LEDs to activate based on the measured value, and on digital switches to selectively activate the identified LEDs. The digital circuitry, however, reduces the overall efficiency of the LED lighting by causing harmonic distortion and power factor distortion in the LED light and the associated power line. In order to reduce the harmonic distortion and power factor distortion caused by the digital circuitry, a current conditioning circuit is presented for selectively routing current to various LED groups in a LED light. The current conditioning circuit uses analog components and circuitry for operation, and produces minimal harmonic distortion and power factor distortion.

The current conditioning circuitry is provided to selectively route current to different LED groups depending on the instantaneous value of an AC input voltage. In an example embodiment, the conditioning circuitry includes only analog circuit components and does not include digital components or digital switches for operation.

The circuitry relies on depletion-mode metal-oxide-semiconductor field-effect transistor (MOSFET) transistors for operation. In an example embodiment, the depletion MOS- FET transistors have a high resistance between their drain and source terminals, and switch between conducting and non-conducting states relatively slowly. The depletion-mode MOSFET transistors may conduct current between their drain and source terminals when a voltage $V_{GS}$ between the gate and source terminals is zero or positive and the MOSFET transistor is operating in the saturation (or active, or conducting) mode (or region, or state). The current through the depletion-mode MOSFET transistor, however, may be restricted if a negative $V_{GS}$ voltage is applied to the terminals and the MOSFET transistor enters the cutoff (or non-conducting) mode (or region, or state).

The MOSFET transistor transitions between the saturation and cutoff modes by operating in the linear or ohmic mode or region, in which the amount of current flowing through the transistor (between the drain and source terminals) is dependent on the voltage between the gate and source terminals $V_{GS}$. In one example, the depletion MOSFET transistors preferably have an elevated resistance between drain and source (when operating in the linear mode) such that the transistors switch between the saturation and cutoff modes relatively slowly. The depletion MOSFET transistors switch between the saturation and cutoff modes by operating in the linear or ohmic region, thereby providing a smooth and gradual transition between the saturation and cutoff modes. In one example, a depletion-mode MOSFET transistor may have a threshold voltage of −2.6 volts, such that the depletion-mode MOSFET transistor allows substantially no current to pass between the drain and source terminals when the gate-source voltage $V_{GS}$ is below −2.6 volts. Other values of threshold voltages may alternatively be used.

Figure 1:
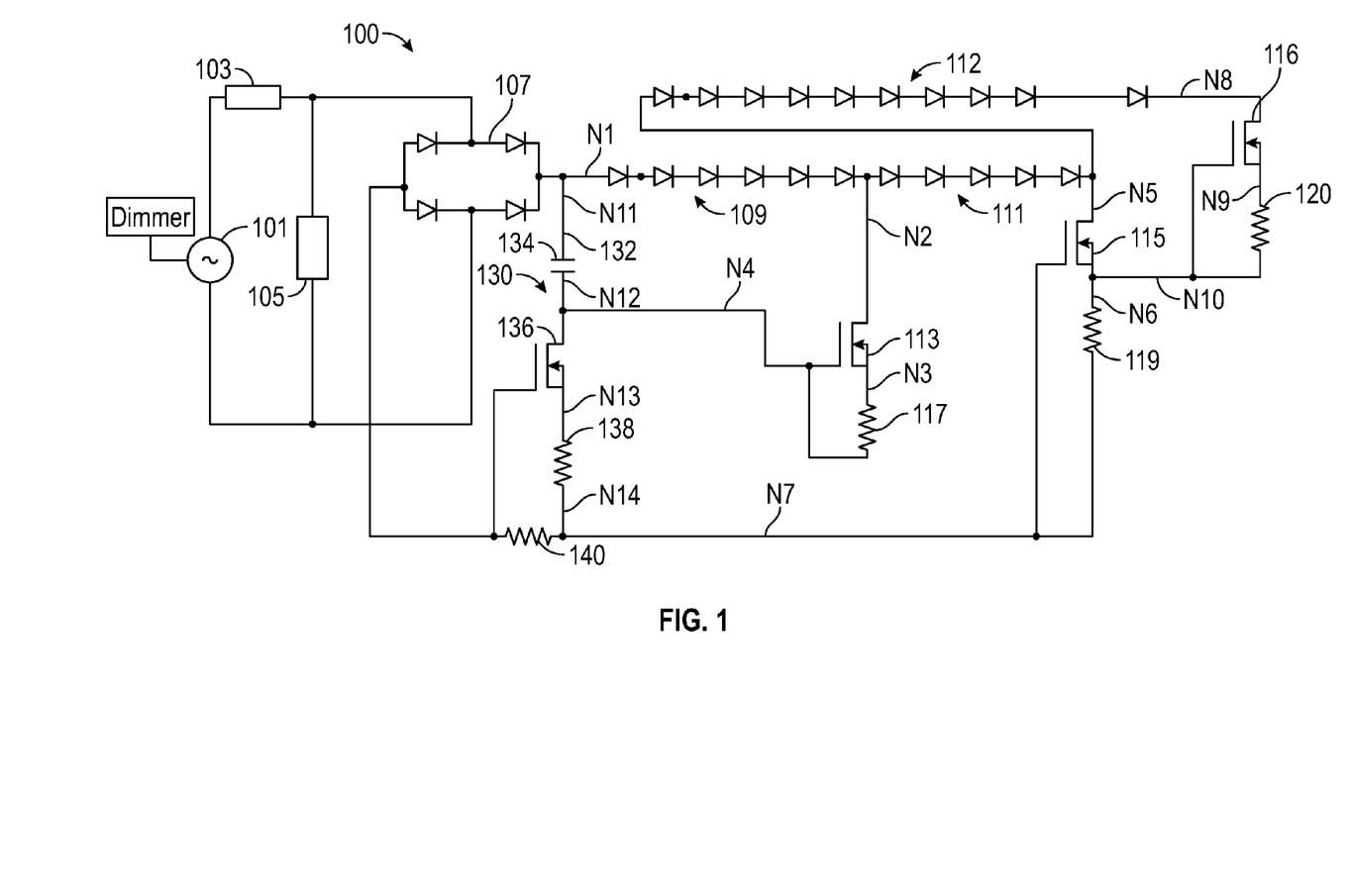
FIG. 1 is a schematic diagram of a circuit.

FIG. 1 is a schematic diagram showing a conditioning circuit 100 for driving three LED groups using a rectified AC input voltage. The conditioning circuit 100 uses analog circuitry to selectively route current to the LED groups based on the instantaneous value of the AC input voltage.

The conditioning circuit 100 receives an AC input voltage from an AC voltage source 101, such as a power supply, an AC line voltage, or the like. The AC voltage source 101 is coupled in series with a fuse 103, and the series interconnection of the AC voltage source 101 and the fuse 103 is coupled in parallel with a transient voltage suppressor (TVS) 105 or other surge protection circuitry. The series interconnection of the AC voltage source 101 and the fuse 103 is further coupled in parallel with two input terminals of a voltage rectifier 107. In one example, the voltage rectifier 107 can include a diode bridge rectifier that provides full-wave rectification of an input sinusoidal AC voltage waveform. In other examples, other types of voltage rectification circuitry can be used.

A first series interconnection of a first LED group 109, a first n-channel depletion MOSFET transistor 113 (coupled by the drain and source terminals), and a first resistor 117 is coupled between the output terminals of the voltage rectifier 107. The first LED group 109 has its anode coupled to the terminal (node N1), and its cathode coupled to the drain terminal of first depletion MOSFET transistor 113 (node N2). The source terminal of first transistor 113 is coupled to a first terminal of resistor 117 (node N3), while both the gate terminal of transistor 113 and the second terminal of resistor 117 are coupled to the other terminal (node N4) of the voltage rectifier 107, such that the voltage across the first resistor 117 serves as the biasing voltage $V_{GS}$ between the gate and source terminals of the first transistor 113.

A second series interconnection of a second LED group 111, a second n-channel depletion MOSFET transistor 115 (coupled by the drain and source terminals), and a second resistor 119 is coupled between the drain and source terminals of the first transistor 113. In particular, the anode of second LED group 111 is coupled to node N2, while the cathode of the second LED group 111 is coupled at node N5 to the drain terminal of the second transistor 115. The source terminal of the second transistor 115 is coupled to a first terminal of the second resistor 119 at node N6, while both the gate terminal of the second transistor 115 and the second terminal of the second resistor 119 are coupled to the other terminal of the rectifier 107 through node N7. The voltage across the second resistor 119 thereby serves as the biasing voltage $V_{GS}$ between the gate and source terminals of the second transistor 115.

This embodiment includes, in series interconnection, a third LED group 112, a third n-channel depletion MOSFET transistor 116, and a third resistor 120 coupled between the cathode of the second LED group 111 and the drain of the third depletion MOSFET transistor 116 through N8. As with previous stages the source terminal of transistor 116 is coupled to a first terminal of resistor 120 (node N9), while both the gate terminal of transistor 116 and the second terminal of resistor 120 are coupled to the voltage rectifier 107 via node N10, such that the voltage across the third resistor 120 serves as the biasing voltage $V_{GS}$ between the gate and source terminals of the third transistor 116. The conditioning circuit 100 selectively routes current to zero, one, two, or all three of the LED groups depending on the instantaneous value of the rectified driving voltage $V_{rect}$.

Inserted into circuit 100 is ancillary circuitry 130 in a pathway 132 in series to the rectifier 107 and bypassing the first LED group 109. In the pathway 132 through node N11 is a first capacitor 134 connected between the drain of a fourth transistor 136 and the rectifier 107 creating a twelfth node N12 between the first capacitor 134 and the drain of fourth or ancillary transistor 136. The source terminal of fourth transistor 136 is coupled to a first terminal of a fourth or ancillary resistor 138 (node N13), while both the gate terminal of transistor 136 and the second terminal of resistor 138 are coupled to the voltage rectifier 107 via node N14, such that the voltage across the fourth resistor 138 serves as the biasing voltage $V_{GS}$ between the gate and source terminals of the fourth transistor 136. A fifth or supplemental resistor 140 is in the pathway back to the rectifier to minimize voltage drops and improve efficiencies by supplementing the second and fourth resistors 119 and 138, respectively.

The circuit 100 may have three voltage thresholds $V_1$, $V_2$, and $V_3$ at which different LED groups are activated. In particular, the first LED group 109 has a driving voltage $V_{rect}$ that exceeds the first voltage threshold $V_1$, the second LED group 111 may be activated for a period [$t_1$, $t_2$] (FIG. 2) during which the driving voltage $V_{rect}$ exceeds the second voltage threshold $V_2$, and the third LED group 112 may be activated for a period [$t_2$, $t_3$] during which the driving voltage $V_{rect}$ exceeds the third voltage threshold $V_3$. As voltage decrease during the period [$t_3$-$t_4$] the driving voltage $V_{rect}$ exceeds only the threshold voltage of the first and second LED groups 109 and 111. Then this cycle repeats.

By having ancillary circuitry 130 the capacitor 134 provides a charge for the diodes in the first LED group 109 to ensure current is always flowing to the first LED group 109 to provide a low level of light output at all times. Even when dimmed through phase cutting, the first LED group 109 continues to receive current and operate to provide light during operation of the circuit 100. At no time during operation does current cease to flow through the first LED group 109, ensuring no periods of the absence of light exist during operation, while preventing the detection of such periods, reducing the gap between the peak of the sine wave to the valley of the sine wave, and improving flicker and dimming properties. This also allows for increased functionality because the first LED group can have a predetermined color, such as green that is known to enhance the growth of plants, while the other LED groups 111 and 112 can have their own predetermined color again to enhance the growth of plants, animals, aquatic life or the like.

Each of the first, second and third LED groups 109, 111 and 112 has a forward voltage (or threshold voltage). The forward voltage generally is a minimum voltage required across the LED group in order for current to flow through the LED group, and/or for light to be emitted by the LED group. The first, second and third LED groups 109, 111 and 112 may have the same forward voltage (e.g., 50 volts), or the first, second and third LED groups 109, 111 and 112 may have different forward voltages (e.g., 60 volts, 50 volts, and 40 volts, respectively).

Figure 2:
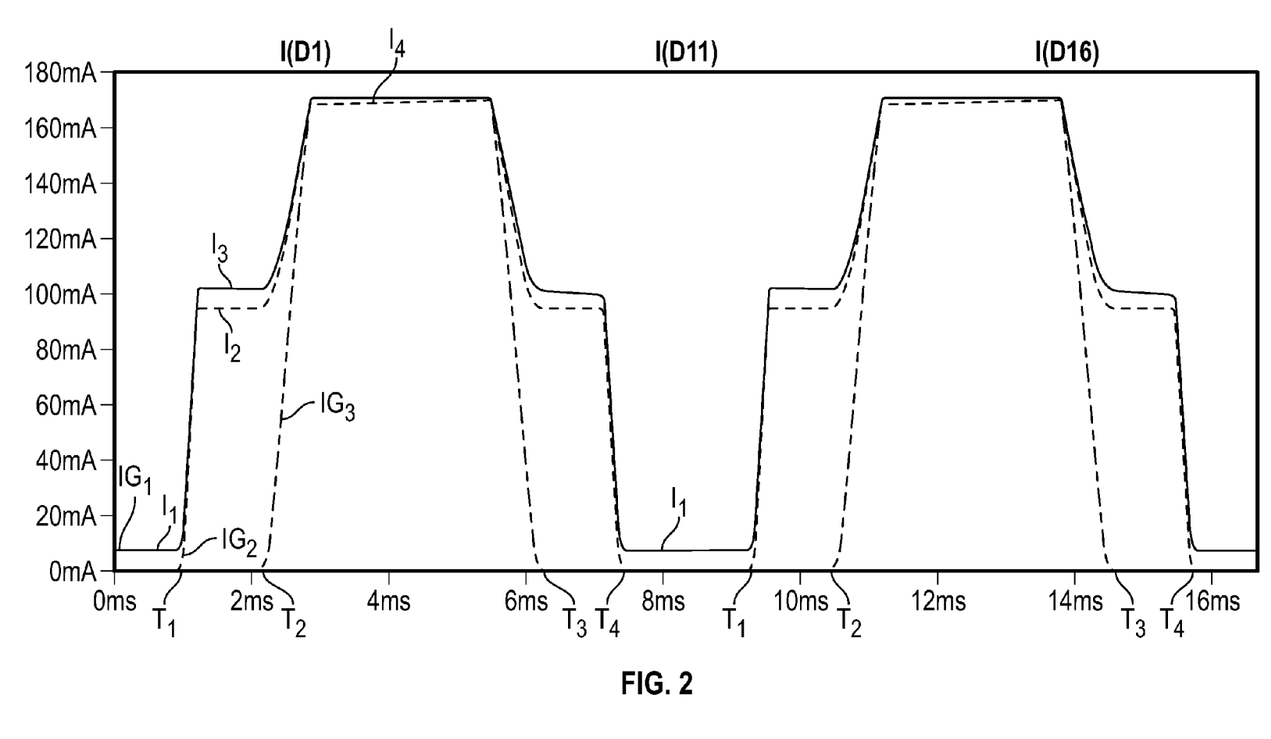
FIG. 2 is a current timing diagram showing the currents flowing through the LED groups of the circuit of FIG. 1.

FIG. 2 is a current timing diagram showing the currents $I_{G1}$, $I_{G2}$ and $I_{G3}$ respectively flowing through the first, second and third LED groups 109, 111 and 112 during one cycle of the rectified voltage $V_{rect}$. As described in relation to FIG. 2, the current $I_{G1}$ through the first LED group 109 constantly as a result of axillary circuit 130 at a first value The current $I_{G1}$ continues to flow through the first LED group 109 from around time $t_1$ to around time $t_4$. Between times $t_1$ and $t_2$, the current $I_{G2}$ flows through the second LED group 111, and reaches a second value $I_2$. During the time period [$t_1$, $t_2$], the current $I_{G1}$ increases to the value $I_3$. Between times $t_2$ and $t_3$, the current $I_{G3}$ flows through the third LED group 112, and reaches a fourth value $I_4$. During the time period [$t_2$, $t_3$], the current $I_{G1}$ and $I_{G2}$ also increase to the value $I_4$.

In general, electrical parameters of the components of circuit 100 can be selected to adjust the functioning of the circuit 100. For example, the forward voltages of the first and second LED groups 109 and 111 may determine the value of the voltages $V_1$ and $V_2$ at which the first and second LED groups are activated. In particular, the voltage $V_1$ may be substantially equal to the forward voltage of the first LED group, while the voltage $V_2$ may be substantially equal to the sum of the forward voltages of the first and second LED groups. In one example, the forward voltage of the first LED group may be set to a value of 60V, for example, while the forward voltage of the second LED group may be set to a value of 40V, such that the voltage $V_1$ is approximately equal to 60V and the voltage $V_2$ is approximately equal to 100V. In addition, the value of the first resistor 117 may be set such that the first depletion MOSFET transistor 113 enters a non-conducting state when the voltage $V_{rect}$ reaches a value of $V_2$. As such the value of the first resistor 117 may be set based on the threshold voltage of the first depletion MOSFET transistor 113, the drain-source resistance of the first depletion MOSFET transistor, and the voltages $V_1$ and $V_2$. In one example, the first resistor may have a value of around 31.6 ohms. Similarly the other electrical components, diodes, transistors and resistor may be altered and manipulated by those skilled in the art without falling outside this disclosure.

The conditioning circuit 100 of FIG. 1 can be used to provide dimmable lighting using the first, second and third LED groups 109, 111 and 112. The conditioning circuitry 100 can, in particular, provide a variable lighting intensity based on the amplitude of the rectified driving voltage $V_{rect}$. The amplitude of the driving voltage $V_{rect}$ may be reduced through the activation of a potentiometer, a dimmer switch, or other appropriate means. While the amplitude of the driving voltage is reduced, the threshold voltages $V_1$ and $V_2$ constant as the threshold voltages are set by parameters of the components of the circuit 100.

Because the driving voltage $V_{rect}$ has a lower amplitude, the driving voltage takes a time [$t_0$, $t_1$] to reach the first threshold voltage $V_1$ during the first half of the first cycle that is longer than the time [$t_0$, $t_1$]. Similarly, the driving voltage takes a time [$t_0$, $t_2'$] to reach the second threshold voltage $V_2$ that is longer than the time [$t_0$, $t_2$]. Additionally, the lower-amplitude driving voltage reaches the second threshold sooner (at a time $t_3'$, which occurs sooner than the time $t_3$) during the second half of each cycle, and similarly reaches the first threshold sooner (at a time $t_4'$, which occurs sooner than the time $t_4$), during the second half of each cycle. As a result, the time-period [$t_1'$, $t_4$] during which current flows through the first LED group 109 is substantially reduced with respect to the corresponding time-period [$t_1$] when the input voltage has full amplitude. Similarly, the time-period [$t_2'$, $t_3'$] during which current flows through the second LED group 111 is substantially reduced with respect to the corresponding time-period [$t_2$, $t_3$] when the input voltage has full amplitude. Similarly the third LED group 112 is affected. Because the lighting intensity produced by each of the first second and third LED groups 109, 111 and 112 is dependent on the total amount of current flowing through the LED groups, the shortening of the time-periods during which current flows through each of the LED groups causes the lighting intensity produced by each of the LED groups to be reduced.

In addition to providing dimmable lighting, the conditioning circuit 100 of FIG. 1 can be used to provide color-dependent dimmable lighting. In order to provide color-dependent dimmable lighting, the first, second and third LED groups 109, 111 and 112 may include LEDs of different colors, or different combinations of LEDs having different colors. When a full amplitude voltage $N^7$ is rect i provided, the light output of the conditioning circuit 100 is provided by both the first, second and third LED groups 109, 111 and 112, and the color of the light output is determined based on the relative light intensity and the respective color light provided by each of the LED groups. As the amplitude of the voltage $V_{rect}$ is reduced, however, the light intensity provided by the third LED group will be reduced more rapidly than the light intensity provided by the first and second LED groups. As a result, the light output of the conditioning circuit 100 will gradually be dominated by the light output (and the color of light) produced by the first and second LED groups. Similarly, the light intensity provided by the second LED group will be reduced more rapidly than the light intensity of the first LED group so that only the color light of the first LED group remains.

The conditioning circuit 100 shown in FIG. 1 includes first, second and third LED groups 109, 111 and 112. Each LED group can be formed of one or more LEDs, or of one or more high-voltage LEDs. In examples in which a LED group includes two or more LEDs (or two or more high-voltage LEDs), the LEDs may be coupled in series and/or in parallel.

Figure 3:
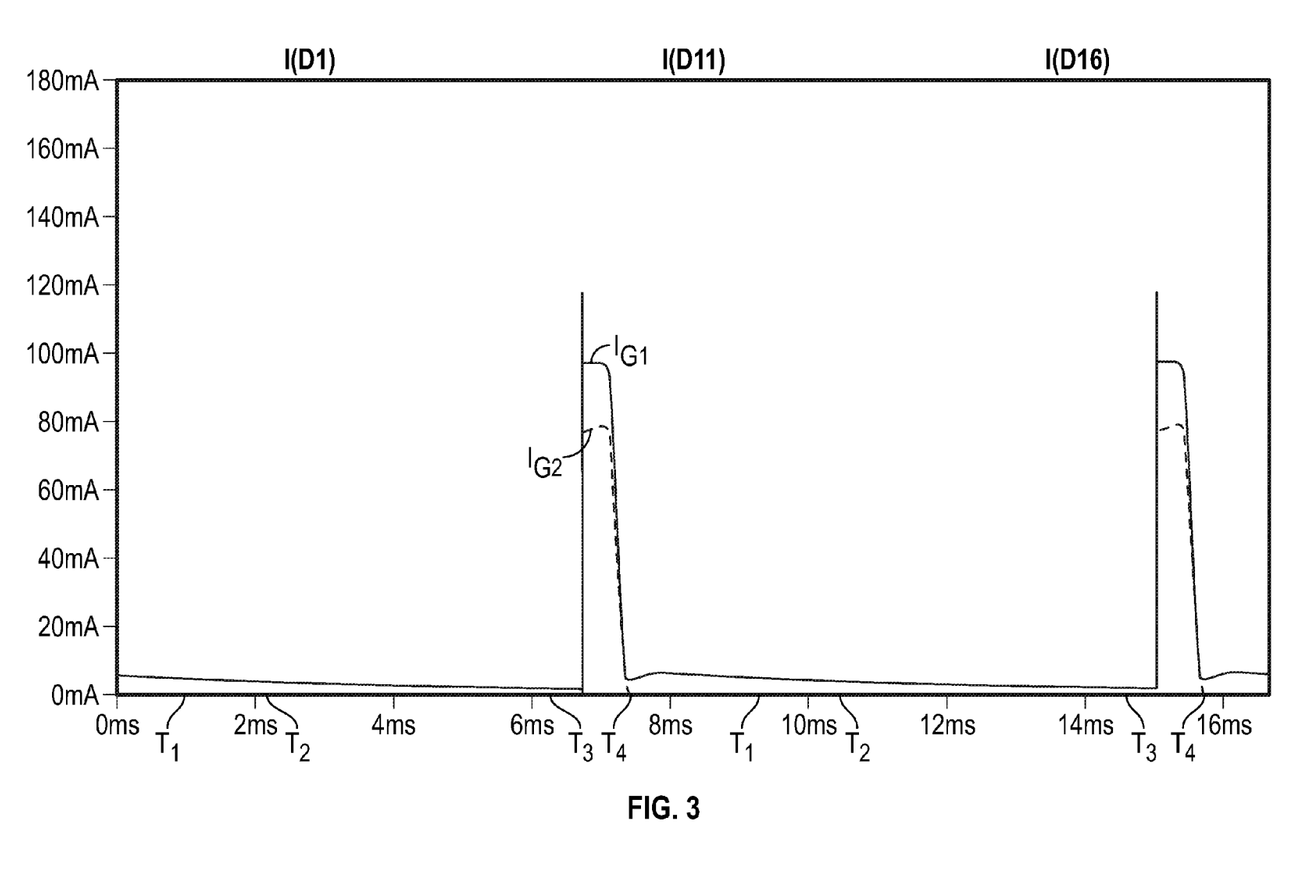
FIG. 3 is a current timing diagram showing the currents flowing through the LED groups of the circuit of FIG. 1 when the circuit of FIG. 1 is dimmed to provide 5% of relative light output.

FIG. 3 is a current timing diagram showing the currents $I_{G1}$, $I_{G2}$, and $I_{G3}$ respectively flowing through the first, second, and third LED groups 109, 111, and 112 during one cycle of operation of the circuit 100 when a phase cutting dimmer is utilized. In particular, according to the timing diagram of FIG. 3, a current $I_{G1}$ flows continually through the first LED group 109 during operation, while a current $I_{G2}$ flows through the second LED group 111 only during part of the period $[t_3, t_4]$ not eliminated by the phase cutting dimmer. Similarly, at this point of operation by the phase cutting dimmer, no current flow through the third group of LEDs 112. Still, the ancillary circuitry 130 ensures current constantly flows to the first LED group 109 to provide continual current and thus light for the lighting device for improved functionality.

The conditioning circuit shown and described in this application, and shown in the figures, and the various modifications to conditioning circuits described in the application, are configured to drive LED lighting circuits with reduced or minimal total harmonic distortion. By using analog circuitry which gradually and selectively routes current to various LED groups, the conditioning circuits provide a high lighting efficiency by driving one, two, or more LED groups based on the instantaneous value of the driving voltage.

Furthermore, by using depletion MOSFET transistors with elevated drain-source resistances $r_{ds}$, the depletion MOSFET transistors transition between the saturation and cutoff modes relatively slowly. As such, by ensuring that the transistors gradually switch between conducting and non-conducting states, the switching on and off of the LED groups and transistors follows substantially sinusoidal contours. As a result, the circuitry produces little harmonic distortion as the LED groups are gradually activated and deactivated. In addition, the first and second (or more) LED groups control current through each other: the forward voltage level of the second LED group influences the current flow through the first LED group, and the forward voltage level of the first LED group influences the current flow through the second LED group. As a result, the circuitry is self-controlling through the interactions between the multiple LED groups and multiple MOSFET transistors.

In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms "base," "emitter," and "collector" may refer to three terminals of a transistor and may refer to a base, an emitter and a collector of a bipolar junction transistor or may refer to a gate, a source, and a drain of a field effect transistor, respectively, and vice versa. In another aspect, the terms "gate," "source," and "drain" may refer to "base," "emitter," and "collector" of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

A reference to an element in the singular is not intended to mean "one and only one" unless specifically so stated, but rather "one or more." For example, a resistor may refer to one or more resistors, a voltage may refer to one or more voltages, a current may refer to one or more currents, and a signal may refer to differential voltage signals.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "example" or an "aspect" does not imply that such example or aspect is essential to the subject technology or that such aspect applies to all configurations of the subject technology. A disclosure relating to an example or an aspect may apply to all configurations, or one or more configurations. An aspect may provide one or more examples. A phrase such as an aspect may refer to one or more aspects and vice versa.

A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an embodiment may refer to one or more embodiments and vice versa. A phrase such as a "configuration" does not imply that such configuration is essential to the subject technology or that such configuration applies to all configurations of the subject technology.

A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., routing, lighting, emitting, driving, flowing, generating, activating, turning on or off selecting, controlling, transmitting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled", "connected", "interconnected", or the like may refer to being directly coupled, connected, or interconnected (e.g., directly electrically coupled, connected, or interconnected). In another aspect, the term "coupled", "connected", "interconnected", or the like may refer to being indirectly coupled, connected, or interconnected (e.g., indirectly electrically coupled, connected, or interconnected).

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Overview, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but is to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

VARIOUS NOTES & EXAMPLES

Example 1 can include or use subject matter (such as an apparatus, a method, or a means for performing acts, when performed by the device, can cause the device to perform acts), such as can include or use a circuit comprising: a first series interconnection of a first light-emitting diode (LED) group, a first transistor, and a first resistor, the first series interconnection including: a cathode coupled to a drain terminal of the first transistor and a source terminal of the first transistor coupled to a first terminal of the first resistor, wherein voltage across the first resistor provides a biasing voltage for the first transistor; a second series interconnection of a second LED group, a second transistor, and a second resistor, the second series interconnection is coupled to a drain terminal of the second transistor, and a source terminal of the second transistor is coupled to a first terminal of the second resistor, wherein voltage across the second resistor provides a biasing voltage for the second transistor; and an ancillary circuit bypassing the first series interconnection and having a capacitor to continuously provide current to the first series interconnection such that the first light-emitting diode (LED) group continuously emits light during operation of the circuit.

Example 2 can include, or can optionally be combined with the subject matter of Example 1, to optionally include wherein the capacitor is connected between the drain of an ancillary transistor and a rectifier wherein the ancillary transistor is coupled to a first terminal of an ancillary resistor to provide a biasing voltage for the ancillary transistor.

Example 3 can include, or can optionally be combined with the subject matter of one or any combination of Examples 1 or 2 to optionally include wherein the first series interconnection of the first light-emitting diode group emits a green light output.

Example 4 can include, or can optionally be combined with the subject matter of one or any combination of Examples 1 through 3 to optionally include wherein the first and second transistors are depletion MOSFET transistors.

Example 5 can include, or can optionally be combined with the subject matter of one or any combination of Examples 1 through 4 to optionally include a dimmer electrically connected to the first series interconnection and the second series interconnection.

Example 6 can include, or can optionally be combined with the subject matter of Example 5, to optionally include wherein the dimmer reduces the voltage below a threshold voltage of the second series interconnection to prevent the second series interconnection from emitting light at a time the first series interconnection emits light.

Example 7 can include, or can optionally be combined with the subject matter of Example 6, to optionally include wherein the dimmer is a phase cut dimmer.

Example 8 can include, or can optionally be combined with the subject matter of one or any combination of Examples 5 through 7 to optionally include wherein the dimmer is actuated to provide a relative light output of 5%.

Example 9 can include, or can optionally be combined with the subject matter of one or any combination of Examples 1 through 8 to optionally include wherein the first series interconnection has a first color characteristic and the second series interconnection has a second color characteristic.

Example 10 can include or use subject matter (such as an apparatus, a method, or a means for performing acts, when performed by the device, can cause the device to perform acts), such as can include or use an electronic circuit, comprising: a light-emitting diode (LED) group including series-connected LEDs, the LED group including an anode end-node, a cathode end-node opposite the anode end-node, and an intermediate node; a first switching device coupled to the intermediate node and configured to energize a first group of at least two LEDs; a second switching device coupled to the cathode end-node and configured to energize a second group of at least two LEDs independent of the first group; and an ancillary circuit bypassing the first group of at least two LEDs and having a capacitor to continuously provide current to the first group of at least two LEDs such that the first group of at least two LEDs continuously emits light during operation of the circuit.

Example 11 can include, or can optionally be combined with the subject matter of Example 10, to optionally include wherein the first switching device includes a first transistor coupled to a first terminal of a first resistor, wherein voltage across the first resistor provides a biasing voltage for the first transistor; and wherein the second switching device includes a second transistor coupled to a first terminal of a second resistor, wherein voltage across the second resistor provides a biasing voltage for the second transistor.

Example 12 can include, or can optionally be combined with the subject matter of one or any combination of Examples 10 or 11 to optionally include an additional LED group including series-connected LEDs, the additional LED group including an additional anode end-node, and an additional cathode end-node opposite the additional anode end-node, the additional anode end-node couple to the cathode end-node; a third switching device coupled to the additional cathode end-node, and configured to energize a third group of at least two LEDs independent of the first group and the second group.

Example 13 can include, or can optionally be combined with the subject matter of one or any combination of Examples 10 through 12 to optionally include wherein the first group of at least two LEDs emits a green light output Example 14 can include, or can optionally be combined with the subject matter of one or any combination of Examples 10 through 13 to optionally include wherein the first switching device and the second switching device include depletion MOSFET transistors.

Example 15 can include, or can optionally be combined with the subject matter of one or any combination of Examples 10 through 14 to optionally include wherein first group of at least two LEDs has a first color characteristic and the second group of at least two LEDs has a second color characteristic.

Example 16 can include, or can optionally be combined with the subject matter of one or any combination of Examples 10 through 15 to optionally include a dimmer electrically connected to the first group of at least two LEDs and the second group of at least two LEDs.

Example 17 can include, or can optionally be combined with the subject matter of Example 16, to optionally include wherein the dimmer is actuated to provide a relative light output of 5%.

Example 18 can include, or can optionally be combined with the subject matter of Example 16, to optionally include wherein the dimmer reduces the voltage below a threshold voltage of the second group of at least two LEDs to prevent the second group of at least two LEDs from emitting light at a time the first group of at least two LEDs emits light.

Example 19 can include, or can optionally be combined with the subject matter of Example 18, to optionally include wherein the dimmer is a phase cut dimmer.

What is claimed:

1. A circuit comprising:
   a first series interconnection of a first light-emitting diode (LED) group, a first transistor, and a first resistor, the first series interconnection including: a cathode coupled to a drain terminal of the first transistor and a source terminal of the first transistor coupled to a first terminal of the first resistor, wherein voltage across the first resistor provides a biasing voltage for the first transistor;
   a second series interconnection of a second LED group, a second transistor, and a second resistor, the second series interconnection is coupled to a drain terminal of the second transistor, and a source terminal of the second transistor is coupled to a first terminal of the second resistor, wherein voltage across the second resistor provides a biasing voltage for the second transistor; and
   an ancillary circuit bypassing the first series interconnection and having a capacitor to continuously provide current to the first series interconnection such that the first light-emitting diode (LED) group continuously emits light during operation of the circuit.

2. The circuit according to claim 1, wherein the capacitor is connected between the drain of an ancillary transistor and a rectifier wherein the ancillary transistor is coupled to a first terminal of an ancillary resistor to provide a biasing voltage for the ancillary transistor.

3. The circuit according to claim 1, wherein the first series interconnection of the first light-emitting diode group emits a green light output.

4. The circuit according to claim 1, wherein the first and second transistors are depletion MOSFET transistors.

5. The circuit according to claim 1, further comprising: a dimmer electrically connected to the first series interconnection and the second series interconnection.

6. The circuit according to claim 5, wherein the dimmer reduces the voltage below a threshold voltage of the second series interconnection to prevent the second series interconnection from emitting light at a time the first series interconnection emits light.

7. The circuit of claim 6, wherein the dimmer is a phase cut dimmer.

8. The circuit of claim 5, wherein the dimmer is actuated to provide a relative light output of 5%.

9. The circuit of claim 1, wherein the first series interconnection has a first color characteristic and the second series interconnection has a second color characteristic.

10. An electronic circuit, comprising:
    a light-emitting diode (LED) group including series-connected LEDs, the LED group including an anode end-node, a cathode end-node opposite the anode end-node, and an intermediate node;
    a first switching device coupled to the intermediate node and configured to energize a first group of at least two LEDs;
    a second switching device coupled to the cathode end-node and configured to energize a second group of at least two LEDs independent of the first group; and
    an ancillary circuit bypassing the first group of at least two LEDs and having a capacitor to continuously provide current to the first group of at least two LEDs such that the first group of at least two LEDs continuously emits light during operation of the circuit.

11. The electronic circuit according to claim 10, wherein the first switching device includes a first transistor coupled to a first terminal of a first resistor, wherein voltage across the first resistor provides a biasing voltage for the first transistor; and
    wherein the second switching device includes a second transistor coupled to a first terminal of a second resistor, wherein voltage across the second resistor provides a biasing voltage for the second transistor.

12. The electronic circuit according to claim 10, further comprising:
    an additional LED group including series-connected LEDs, the additional LED group including an additional anode end-node, and an additional cathode end-node opposite the additional anode end-node, the additional anode end-node couple to the cathode end-node;
    a third switching device coupled to the additional cathode end-node, and configured to energize a third group of at least two LEDs independent of the first group and the second group.

13. The electronic circuit according to claim 10, wherein the first group of at least two LEDs emits a green light output.

14. The electronic circuit according to claim 10, wherein the first switching device and the second switching device include depletion MOSFET transistors.

15. The electronic circuit of claim 10, wherein first group of at least two LEDs has a first color characteristic and the second group of at least two LEDs has a second color characteristic.

16. The electronic circuit according to claim 10, further comprising: a dimmer electrically connected to the first group of at least two LEDs and the second group of at least two LEDs.

17. The electronic circuit of claim 16, wherein the dimmer is actuated to provide a relative light output of 5%.

18. The electronic circuit according to claim 16, wherein the dimmer reduces the voltage below a threshold voltage of the second group of at least two LEDs to prevent the second group of at least two LEDs from emitting light at a time the first group of at least two LEDs emits light.

19. The electronic circuit of claim 18, wherein the dimmer is a phase cut dimmer.

* * * * *